US011239868B2

(12) United States Patent  
Shinozaki et al.

(10) Patent No.: US 11,239,868 B2  
(45) Date of Patent: Feb. 1, 2022

(54) RADIO FREQUENCY MODULE AND COMMUNICATION DEVICE

(71) Applicant: Murata Manufacturing Co., Ltd., Nagaokakyo (JP)

(72) Inventors: Takayuki Shinozaki, Nagaokakyo (JP); Yukiya Yamaguchi, Nagaokakyo (JP); Morio Takeuchi, Nagaokakyo (JP); Yoichi Sawada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/016,390

(22) Filed: Sep. 10, 2020

(65) Prior Publication Data

US 2021/0091801 A1    Mar. 25, 2021

(30) Foreign Application Priority Data

Sep. 20, 2019  (JP) .............................. JP2019-171568  
Mar. 27, 2020  (JP) .............................. JP2020-057911

(51) Int. Cl.  
*H04B 1/04*   (2006.01)  
*H03F 3/195*  (2006.01)

(52) U.S. Cl.  
CPC .............. *H04B 1/04* (2013.01); *H03F 3/195* (2013.01); *H03F 2200/267* (2013.01); *H03F 2200/294* (2013.01); *H03F 2200/451* (2013.01); *H04B 2001/0408* (2013.01)

(58) Field of Classification Search  
CPC ......... H01L 21/84; H01L 23/60; H01L 24/16; H01L 25/16; H03C 1/62; H03F 1/56; H03F 3/19; H03F 3/21; H03F 3/24; H03F 3/195; H03F 2200/267; H03F 2200/294; H03F 2200/451; H04B 1/00; H04B 1/04; H04B 1/16; H04B 1/28; H04B 1/38; H04B 1/44; H04B 1/48; H04B 1/0053; H04B 1/0057; H04B 1/0475; H04B 17/00; H04B 200/0408; H04M 1/02; H04M 1/0277  
USPC ........... 333/129, 132, 133; 375/262; 455/82, 455/115.1, 127.1, 323, 333, 522  
See application file for complete search history.

(56) References Cited

U.S. PATENT DOCUMENTS

2005/0245212 A1* 11/2005 Ono ...................... H03G 3/3047  
                                                455/127.1  
2015/0303971 A1* 10/2015 Reisner ................ H04B 1/0458  
                                                455/77  
2018/0096951 A1*  4/2018 Chen ....................... H01L 23/66

FOREIGN PATENT DOCUMENTS

JP    2018-137522 A    8/2018  
JP    2018-181943 A   11/2018  
WO    2018/168500 A1   9/2018

OTHER PUBLICATIONS

Korean Notification of Reasons for Refusal dated Sep. 2, 2021 in Korean Application No. 10-2020-0110873.

* cited by examiner

*Primary Examiner* — Shawkat M Ali  
(74) *Attorney, Agent, or Firm* — Xsensus LLP

(57) ABSTRACT

A radio frequency module includes a module board including a first principal surface and a second principal surface on opposite sides thereof, a transmission power amplifier, a control circuit that controls the transmission power amplifier, and a first inductor connected to an output terminal of the transmission power amplifier. The control circuit is disposed on the first principal surface, and the first inductor is disposed on the second principal surface.

11 Claims, 6 Drawing Sheets

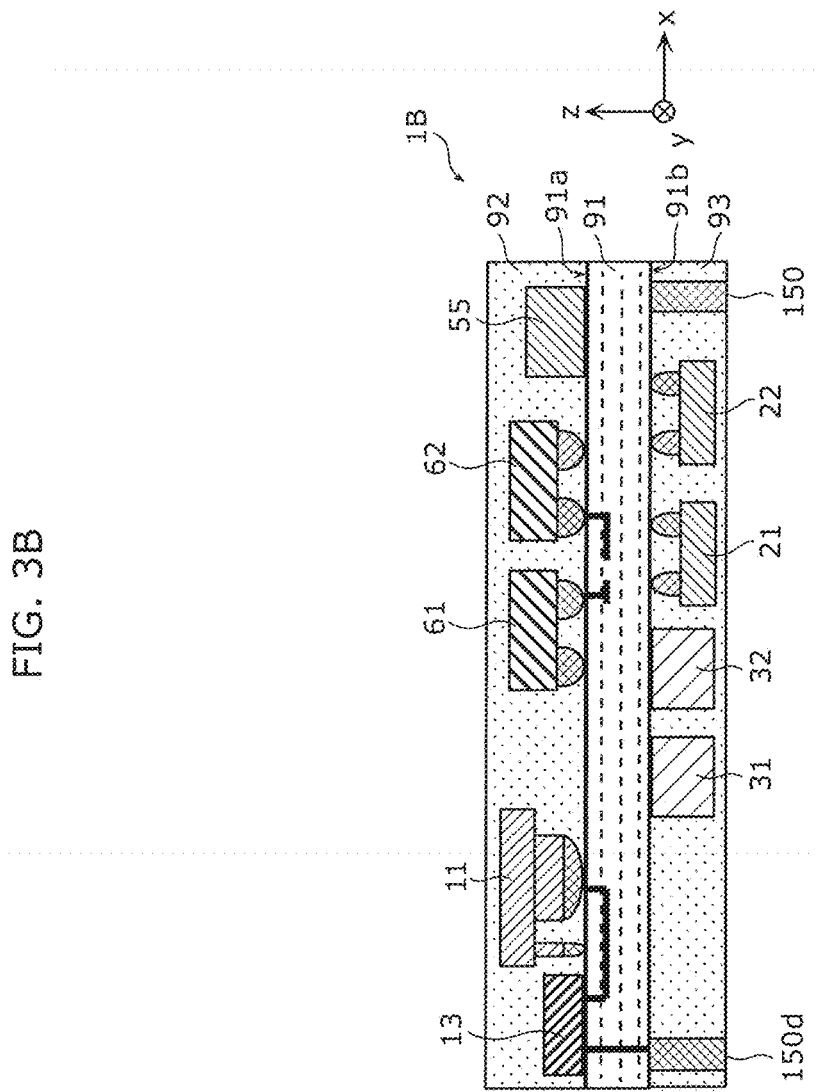

RADIO FREQUENCY MODULE AND COMMUNICATION DEVICE

CROSS REFERENCE TO RELATED APPLICATIONS

The present application is based on and claims priority to Japanese Patent Application No. 2019-171568 filed on Sep. 20, 2019 and Japanese Patent Application No. 2020-057911 filed on Mar. 27, 2020. The entire disclosures of the above-identified applications, including the specification, drawings and claims are incorporated herein by reference in their entirety.

TECHNICAL FIELD

The present disclosure relates to a radio frequency module and a communication device.

BACKGROUND

In mobile communication apparatuses such as a mobile phone the arrangement configuration of circuit elements included in radio frequency (RF) front-end circuits is becoming complex, particularly with developments in multiband technologies.

Japanese Unexamined Patent Application Publication No. 2018-181943 discloses a power amplifying module including power amplifiers in an output stage and a driver stage, matching circuits provided at a front stage, a mid-stage, and a back stage to the power amplifiers, a switch for selectively connecting the power amplifiers to any of a plurality of transmission paths, and a control circuit that controls the operation of the power amplifiers. According to this configuration, it is possible to ensure sufficient isolation between the input and output signals of the power amplifier.

SUMMARY

Technical Problems

However, as recognized by the present inventor, when the power amplifying module described in Japanese Unexamined Patent Application Publication No. 2018-181943 is included, as a transmission circuit, in a small transceiver module, there are cases where a digital control signal output from the control circuit that controls a power amplifier causes generation of a spurious signal in the adjacent channel of the transmission signal that passes the power amplifier and a switch. Consequently, there is the issue that the adjacent channel leakage ratio (ACLR) of the transmission signal deteriorates, and thus transmission signal quality deteriorates.

The present disclosure provides a radio frequency module that suppresses transmission signal quality deterioration and a communication device including the radio frequency module.

Solutions

A radio frequency module according to an aspect of the present disclosure includes: a module board including a first principal surface and a second principal surface on opposite sides of the module board; a transmission power amplifier disposed on the module board; a control circuit configured to control the transmission power amplifier; and a first inductor connected to an output terminal of the transmission power amplifier, wherein the control circuit is disposed on the first principal surface, and the first inductor is disposed on the second principal surface.

Advantageous Effects

The present disclosure is capable of providing a radio frequency module and a communication device that suppress deterioration of transmission signal quality.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3B is a schematic diagram illustrating a cross-sectional configuration of the radio frequency module according to Working Example 2.

DESCRIPTION OF EMBODIMENTS

Figure 1:
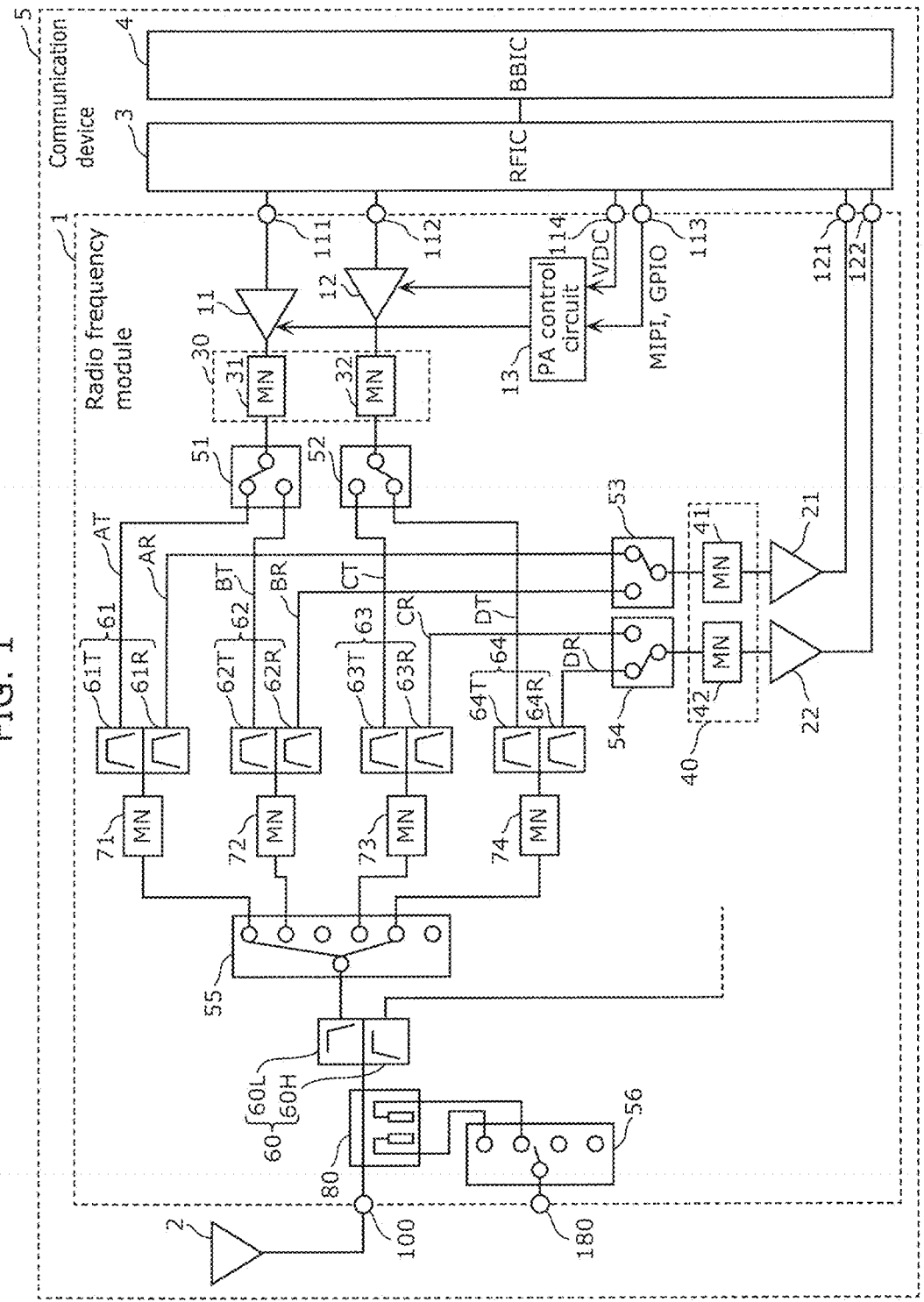
FIG. 1 is a circuit configuration diagram of a radio frequency module (or RF front-end circuitry) and a communication device according to an embodiment.

Hereinafter, exemplary embodiments of the present disclosure will be described in detail with reference to the drawings. It should be noted that each of the subsequently described exemplary embodiments shows a generic or a specific example. The numerical values, shapes, materials, elements, the arrangement and connection of the elements, and others indicated in the following exemplary embodiments are mere examples, and therefore are not intended to limit the present disclosure. Among the elements described in the following exemplary embodiments and variations, elements not recited in any one of the independent claims are described as optional elements. In addition, the sizes of the elements and the ratio of the sizes illustrated in the drawings are not necessarily accurate. In the figures, elements which are substantially the same are given the same reference signs, and overlapping description is omitted or simplified.

Furthermore, hereinafter, terms indicating a relationship between elements such as "parallel" and "perpendicular", terms indicating the shape of an element such as rectangular, as well as numerical ranges are not only expressions with strict meanings, but also expressions whose meanings include substantially the same range, such as an error of several percent, for example.

Furthermore, with regard to A, B, and C which are mounted on a board in the subsequent description, "C is mounted between A and B in a plan view of the board (or a principal surface of the board)" means that, in a plan view of the board, at least one of a plurality of lines connecting arbitrary points in A and arbitrary points in B passes through the region of C. Furthermore, a plan view of the board means viewing the board and circuit elements mounted on the board by orthographic projection of a plane parallel to a principal plane of the board.

Furthermore, in the subsequent description, "A is disposed on a first principal surface of the board" refers, not only to the state in which A is directly mounted on the first principal surface, but also to the state in which A is mounted in the space on the first principal surface-side, out of the space on the first principal surface-side and the space on the second principal surface-side which are isolated by the board. Specifically, the above expression includes the state in which A is mounted on the first principal surface via another circuit element, electrode, or the like.

Furthermore, in the subsequent description, "transmission path" refers to the transfer path formed by a line for transferring a radio frequency signal, an electrode directly connected to the line, a terminal directly connected to the line or the electrode, and so on. Furthermore, in the subsequent description, "reception path" refers to the transfer path formed by a line for receiving a radio frequency signal, an electrode directly connected to the line, a terminal directly connected to the line or the electrode, and so on. Furthermore, "signal path" refers to the transfer path formed by a line for transferring a radio frequency signal, an electrode directly connected to the line, a terminal directly connected to the line or the electrode, and so on. Furthermore, as used herein, the term "circuit" or "circuitry" means one or more circuits, including discrete circuit(s) as well as circuit board (s) and combinations thereof.

Embodiment

1. Circuit Configuration of Radio Frequency Module 1 and Communication Device 5

FIG. 1 is a circuit configuration diagram of radio frequency module 1 and communication device 5 according to an embodiment. As illustrated in the figure, communication device 5 includes radio frequency module 1, antenna 2, RF signal processing circuit (RFIC) 3, and baseband signal processing circuit (BBIC) 4. In this exemplary configuration, the communication device is a multi-band transceiver. As used in this specification, the term "module", as used with "radio frequency module", or "RF front-end module" should be construed as circuitry (programmable, as well as discrete) and associated circuit components, such as circuit boards, RF shielding, etc.

RFIC 3 is an RF signal processing circuit that processes a radio frequency signal that is to be transmitted or has been received by antenna 2. Specifically, RFIC 3 performs, by downconversion, and so on, signal processing on a reception signal input via a reception path of radio frequency module 1, and outputs the reception signal generated by the signal processing to BBIC 4. Furthermore, RFIC 3 performs, by upconversion, and so on, signal processing on a transmission signal input from BBIC 4, and outputs the transmission signal generated by the signal processing to a transmission path of radio frequency module 1.

BBIC 4 is a circuit that performs signal processing using an intermediate frequency band having a lower frequency than a radio frequency signal transferred in radio frequency module 1. The signal processed by BBIC 4 is, for example, used as an image signal for image display or as a sound signal for communication via a speaker.

Furthermore, RFIC 3 also functions as a controller that controls the connection of switches 51, 52, 53, 54, 55, and 56 included in radio frequency module 1, based on the communication band (frequency band) to be used. Specifically, RFIC 3 controllably switches the connection(s) of switches 51 to 56 included in radio frequency module 1 according to a control signal (not illustrated). Specifically, RFIC 3 outputs, to PA control circuit 13, digital control signals for controlling switches 51 to 56. PA control circuit 13 of radio frequency module 1 controls the connection and disconnection of switches 51 to 56 by outputting digital control signals to switches 51 to 56, according to digital control signals input from RFIC 3.

Furthermore, RFIC 3 also functions as a controller that controls the gain of transmission power amplifiers 11 and 12 included in radio frequency module 1 as well as power supply voltage Vcc and bias voltage Vbias supplied to transmission power amplifiers 11 and 12. Specifically, RFIC 3 outputs digital control signals such as MIDI and GPIO to control signal terminal 113 of radio frequency module 1. PA control circuit 13 of radio frequency module 1 adjusts the gain of transmission power amplifiers 11 and 12 by outputting control signals, power supply voltage Vcc, or bias voltage Vbias to transmission power amplifiers 11 and 12, according to digital control signals input via control signal terminals 113 and 114. It should be noted that the control signal terminal that receives, from RFIC 3, the digital control signals for controlling the gain of transmission power amplifiers 11 and 12 and the control signal terminal that receives, from RFIC 3, the digital control signals for controlling power supply voltage Vcc and bias voltage Vbias to be supplied to transmission power amplifiers 11 and 12 may be different. It should be noted that the controller may be provided outside RFIC 3, and may be provided in BBIC 4, for example. Moreover, in one example, the controller is a remote computer, or a distributed computer system that communicates with the radio frequency module 1 via a wireless or wired connection. Likewise, in another example, the controller is a local controller with a user interface that converts input signals into control commands that control the communication device 5 as well as subcomponents, such as the RF module 1.

Antenna 2 is connected to antenna connection terminal 100 of radio frequency module 1, emits radio frequency signals output from radio frequency module 1, and receives radio frequency signals from the outside and outputs the received radio frequency signals to radio frequency module 1.

It should be noted that in communication device 5 according to this embodiment, antenna 2 and BBIC 4 are not essential elements, and thus communication device 5 may include interface ports to accommodate antenna 2 and BBIC 4 as auxiliary components.

Next, the detailed configuration of radio frequency module 1 will be described.

As illustrated in FIG. 1, radio frequency module 1 includes antenna connection terminal 100, transmission power amplifiers 11 and 12, reception low-noise amplifiers (LNAs) 21 and 22, PA control circuit 13, transmission filters 61T, 62T, 63T, and 64T, reception filters 61R, 62R, 63R, and 64R, transmission output matching circuit 30, reception input matching circuit 40, matching circuits 71, 72, 73, and 74, switches 51, 52, 53, 54, 55, and 56, diplexer 60, coupler 80, coupler output terminal 180.

Antenna connection terminal 100 is an example of an input/output terminal, and is an antenna common terminal connected to antenna 2.

Transmission power amplifier 11 is an amplifier that amplifies radio frequency signals of communication band A (first communication band) and communication band B (second communication band) which belong to a first frequency band group and are input through transmission input terminal 111 (input terminal). Furthermore, transmission power amplifier 12 is an amplifier that amplifies radio frequency signals of communication band C and communication band D which belong to a second frequency band group different in frequency from the first frequency band group and are input through transmission input terminal 112 (input terminal).

PA control circuit 13 is an example of a control circuit that adjusts the gain of transmission power amplifiers 11 and 12 according to digital control signals MIPI and GPIO input via control signal terminals 113 and 114. PA control circuit 13 may be formed in a first semiconductor integrated circuit (IC). The first semiconductor IC is configured using, for example, a complementary metal oxide semiconductor (CMOS). Specifically, the first semiconductor IC is formed using a silicon on insulator (SOI) process. Accordingly, the first semiconductor IC can be manufactured at low cost. It should be noted that the first semiconductor IC may be formed using at least one of GaAs, SiGe, or GaN. Accordingly, radio frequency signals having high quality amplification performance and noise performance can be output.

Reception low-noise amplifier 21 is an amplifier that amplifies radio frequency signals of communication band A and communication band B with low noise, and outputs the amplified radio frequency signals to reception output terminal 121 (output terminal). Furthermore, reception low-noise amplifier 22 is an amplifier that amplifies radio frequency signals of communication band C and communication band D with low noise, and outputs the amplified radio frequency signals to reception output terminal 122 (output terminal).

Transmission filter 61T is connected to transmission path AT connecting transmission input terminal 111 and antenna connection terminal 100, and passes transmission signals of the transmission band of communication band A out of the transmission signals amplified by transmission power amplifier 11. Furthermore, transmission filter 62T is connected to transmission path BT connecting transmission input terminal 111 and antenna connection terminal 100, and passes transmission signals of the transmission band of communication band B out of the transmission signals amplified by transmission power amplifier 11. In addition, transmission filter 63T is connected to transmission path CT connecting transmission input terminal 112 and antenna connection terminal 100, and passes transmission signals of the transmission band of communication band C out of the transmission signals amplified by transmission power amplifier 12. Moreover, transmission filter 64T is connected to transmission path DT connecting transmission input terminal 112 and antenna connection terminal 100, and passes transmission signals of the transmission band of communication band D out of the transmission signals amplified by transmission power amplifier 12.

Reception filter 61R is connected to reception path AR connecting reception output terminal 121 and antenna connection terminal 100, and passes reception signals of the reception band of communication band A out of the reception signals input from antenna connection terminal 100. Furthermore, reception filter 62R is connected to reception path BR connecting reception output terminal 121 and antenna connection terminal 100, and passes reception signals of the reception band of communication band B out of the reception signals input from antenna connection terminal 100. In addition, reception filter 63R is connected to reception path CR connecting reception output terminal 122 and antenna connection terminal 100, and passes reception signals of the reception band of communication band C out of the reception signals input from antenna connection terminal 100. Moreover, reception filter 64R is connected to reception path DR connecting reception output terminal 122 and antenna connection terminal 100, and passes reception signals of the reception band of communication band D out of the reception signals input from antenna connection terminal 100.

Transmission filter 61T and reception filter 61R constitute duplexer 61 which has, as a passband, communication band A. Furthermore, transmission filter 62T and reception filter 62R constitute duplexer 62 which has, as a passband, communication band B. In addition, transmission filter 63T and reception filter 63R constitute duplexer 63 which has, as a passband, communication band C. Moreover, transmission filter 64T and reception filter 64R constitute duplexer 64 which has, as a passband, communication band D.

It should be noted that each of duplexers 61 to 64 may be a multiplexer consisting of only a plurality of transmission filters, a multiplexer consisting of only a plurality of reception filters, or a multiplexer consisting of a plurality of duplexers.

Transmission path AT is for transferring transmission signals of communication band A. One end of transmission path AT is connected to antenna connection terminal 100, and the other end of transmission path AT is connected to transmission input terminal 111. Transmission path BT is for transferring transmission signals of communication band B. One end of transmission path BT is connected to antenna connection terminal 100, and the other end of transmission path BT is connected to transmission input terminal 111. Transmission path CT is for transferring transmission signals of communication band C. One end of transmission path CT is connected to antenna connection terminal 100, and the other end of transmission path CT is connected to transmission input terminal 112. Transmission path DT is for transferring transmission signals of communication band D. One end of transmission path DT is connected to antenna connection terminal 100, and the other end of transmission path DT is connected to transmission input terminal 112.

Reception path AR is for transferring reception signals of communication band A. One end of reception path AR is connected to antenna connection terminal 100, and the other end of reception path AR is connected to reception output terminal 121. Reception path BR is for transferring reception signals of communication band B. One end of reception path BR is connected to antenna connection terminal 100, and the other end of reception path BR is connected to reception output terminal 121. Reception path CR is for transferring reception signals of communication band C. One end of reception path CR is connected to antenna connection terminal 100, and the other end of reception path CR is connected to reception output terminal 122. Reception path DR is for transferring reception signals of communication band D. One end of reception path DR is connected to antenna connection terminal 100, and the other end of reception path DR is connected to reception output terminal 122.

Here, each of reception low-noise amplifier 21, the circuit elements of matching circuit 41, switch 53, and reception filters 61R and 62R is a first circuit component that is connected to reception paths AR and BR for transferring reception signals. Here, each of reception low-noise amplifier 22, the circuit elements of matching circuit 42, switch 54, reception filters 63R and 64R is a first circuit component that is connected to reception paths CR and DR for transferring reception signals. Furthermore, each of diplexer 60 and switch 55 is a first circuit component that is connected to reception paths AR, BR, CR, and DR for transferring reception signals.

Transmission output matching circuit 30 includes matching circuits 31 and 32. Matching circuit 31 is connected to a transmission path connecting transmission power amplifier 11 and transmission filters 61T and 62T, and matches impedances of transmission power amplifier 11 and transmission filters 61T and 62T. Matching circuit 32 is connected to a transmission path connecting transmission power amplifier 12 and transmission filters 63T and 64T, and matches impedances of transmission power amplifier 12 and transmission filters 63T and 64T. Each of matching circuits 31 and 32 includes at least a first inductor which is in chip form.

Reception input matching circuit 40 includes matching circuits 41 and 42. Matching circuit 41 is connected in a reception path connecting reception low-noise amplifier 21 and reception filters 61R and 62R, and matches impedances of reception low-noise amplifier 21 and reception filters 61R and 62R. Matching circuit 42 is connected in a reception path connecting reception low-noise amplifier 22 and reception filters 63R and 64R, and matches impedances of reception low-noise amplifier 22 and reception filters 63R and 64R.

Switch 51 includes a common terminal and two selection terminals. The common terminal of switch 51 is connected to the output terminal of transmission power amplifier 11 via matching circuit 31. One selection terminal of switch 51 is connected to transmission filter 61T connected to transmission path AT, and the other selection terminal of switch 51 is connected to transmission filter 62T connected to transmission path BT In this connection configuration, switch 51 switches between connecting and disconnecting the common terminal and the one selection terminal and connecting and disconnecting the common terminal and the other selection terminal. In other words, switch 51 switches between connecting and disconnecting the output terminal of transmission power amplifier 11 and transmission filter 61T and connecting and disconnecting the output terminal of transmission power amplifier 11 and transmission filter 62T. Switch 51 is, for example, a single pole, double throw (SPDT) switch circuit.

Switch 52 includes a common terminal and two selection terminals. The common terminal of switch 52 is connected to the output terminal of transmission power amplifier 12 via matching circuit 32. One selection terminal of switch 52 is connected to transmission filter 63T connected to transmission path CT, and the other selection terminal of switch 52 is connected to transmission filter 64T connected to transmission path DT In this connection configuration, switch 52 switches between connecting and disconnecting the common terminal and the one selection terminal and connecting and disconnecting the common terminal and the other selection terminal. In other words, switch 52 switches between connecting and disconnecting the output terminal of transmission power amplifier 12 and transmission filter 63T and connecting and disconnecting the output terminal of transmission power amplifier 12 and transmission filter 64T. Switch 52 is, for example, an SPDT switch circuit.

Switch 53 includes a common terminal and two selection terminals. The common terminal of switch 53 is connected to the input terminal of reception low-noise amplifier 21 via matching circuit 41. One selection terminal of switch 53 is connected to reception filter 61R connected to reception path AR, and the other selection terminal of switch 53 is connected to reception filter 62R connected to reception path BR. In this connection configuration, switch 53 switches between connecting and disconnecting the common terminal and the one selection terminal, and connecting and disconnecting the common terminal and the other selection terminal. In other words, switch 53 switches between connecting and disconnecting reception low-noise amplifier 21 and reception path AR, and switches between connecting and disconnecting reception low-noise amplifier 21 and reception path BR. Switch 53 is, for example, an SPDT switch circuit.

Switch 54 includes a common terminal and two selection terminals. The common terminal of switch 54 is connected to the input terminal of reception low-noise amplifier 22 via matching circuit 42. One selection terminal of switch 54 is connected to reception filter 63R connected to reception path CR, and the other selection terminal of switch 54 is connected to reception filter 64R connected to reception path DR. In this connection configuration, switch 54 switches between connecting and disconnecting the common terminal and the one selection terminal, and connecting and disconnecting the common terminal and the other selection terminal. In other words, switch 54 switches between connecting and disconnecting reception low-noise amplifier 22 and reception path CR, and switches between connecting and disconnecting reception low-noise amplifier 22 and reception path DR. Switch 54 is, for example, an SPDT switch circuit.

Switch 55, which is an example of an antenna switch, is connected to antenna connection terminal 100 via diplexer 60, and switches between (1) connecting and disconnecting antenna connection terminal 100 and transmission path AT and reception path AR, (2) connecting and disconnecting antenna connection terminal 100 and transmission path BT and reception path BR, (3) connecting and disconnecting antenna connection terminal 100 and transmission path CT and reception path CR, and (4) connecting and disconnecting antenna connection terminal 100 and transmission path DT and reception path DR. It should be noted that switch 55 is a multiple-connection switch circuit capable of simultaneously performing two or more connections among (1) to (4) above.

Matching circuit 71 is connected to a path connecting switch 55 and duplexer 61, and matches impedances of (i) antenna 2 and switch 55 and (ii) duplexer 61. Matching circuit 72 is connected to a path connecting switch 55 and duplexer 62, and matches impedances of (i) antenna 2 and switch 55 and (ii) duplexer 62. Matching circuit 73 is connected to a path connecting switch 55 and duplexer 63, and matches impedances of (i) antenna 2 and switch 55 and (ii) duplexer 63. Matching circuit 74 is connected to a path connecting switch 55 and duplexer 64, and matches impedances of (i) antenna 2 and switch 55 and (ii) duplexer 64.

Diplexer 60 is an example of a multiplexer, and consists of filters 60L and 60H. Filter 60L is an example of an LC filter which includes at least one of an inductor or a capacitor which is in chip form, and has, as a passband, a frequency range including the first frequency band group and the second frequency band group. Filter 60H is an example of an LC filter which includes at least one of an inductor or a capacitor which is in chip form, and has, as a passband, a frequency range including an other frequency band group different in frequency from the first frequency band group and the second frequency band group. One terminal of filter 60L and one terminal of filter 60H is connected in common to antenna connection terminal 100. It should be noted that, when the first frequency band group and the second frequency band group are located more to the low frequency side than the other frequency band group is, filter 60L may be a low-pass filter and filter 60H may be a high-pass filter.

Coupler 80 and switch 56 form a circuit that monitors the power intensity of radio frequency signals transferred between antenna connection terminal 100 and switch 55, and output the monitored power intensity to RFIC 3 via coupler output terminal 180.

It should be noted that transmission filters 61T to 64T and reception filters 61R to 64R may be any of acoustic wave filters that make use of surface acoustic waves (SAW), acoustic wave filters that make use of bulk acoustic waves (BAW), LC resonant filters, and dielectric filters, for example, but are not limited to these filters.

Furthermore, transmission power amplifiers 11 and 12 and reception low-noise amplifiers 21 and 22 are each configured using, for example, a field effect transistor (FET) or a heterojunction bipolar transistor (HBT) made of, for instance, a Si-based complementary metal oxide semiconductor (CMOS) or GaAs.

Furthermore, reception low-noise amplifiers 21 and 22 and switches 53, 54, and 55 may be formed in a second semiconductor integrated circuit (IC). In addition, the second semiconductor IC may further include transmission power amplifiers 11 and 12 and switches 51 and 52. The second semiconductor IC is configured using a CMOS, for example. Specifically, the second semiconductor IC is formed using a silicon on insulator (SOI) process. Accordingly, the second semiconductor IC can be manufactured at low cost. It should be noted that the second semiconductor IC may be formed using at least one of GaAs, SiGe, or GaN. Accordingly, radio frequency signals having high quality amplification performance and noise performance can be output.

It should be noted that matching circuits 71 to 74, coupler 80, switch 56, and coupler output terminal 180 are not essential elements of the radio frequency module according the present disclosure.

In the configuration of radio frequency module 1 described above, transmission power amplifier 11, matching circuit 31, switch 51, transmission filter 61T, matching circuit 71, switch 55, and filter 60L form a first transmission circuit that transfers transmission signals of communication band A toward antenna connection terminal 100. Furthermore, filter 60L, switch 55, matching circuit 71, reception filter 61R, switch 53, matching circuit 41, and reception low-noise amplifier 21 form a first reception circuit that transfers reception signals of communication band A from antenna 2 via antenna connection terminal 100.

Furthermore, transmission power amplifier 11, matching circuit 31, switch 51, transmission filter 62T, matching circuit 72, switch 55, and filter 60L form a second transmission circuit that transfers transmission signals of communication band B toward antenna connection terminal 100. In addition, filter 60L, switch 55, matching circuit 72, reception filter 62R, switch 53, matching circuit 41, and reception low-noise amplifier 21 form a second reception circuit that transfers reception signals of communication band B from antenna 2 via antenna connection terminal 100.

Furthermore, transmission power amplifier 12, matching circuit 32, switch 52, transmission filter 63T, matching circuit 73, switch 55, and filter 60L form a third transmission circuit that transfers transmission signals of communication band C toward antenna connection terminal 100. In addition, filter 60L, switch 55, matching circuit 73, reception filter 63R, switch 54, matching circuit 42, and reception low-noise amplifier 22 form a third reception circuit that transfers reception signals of communication band C from antenna 2 via antenna connection terminal 100.

Furthermore, transmission power amplifier 12, matching circuit 32, switch 52, transmission filter 64T, matching circuit 74, switch 55, and filter 60L form a fourth transmission circuit that transfers transmission signals of communication band D toward antenna connection terminal 100. In addition, filter 60L, switch 55, matching circuit 74, reception filter 64R, switch 54, matching circuit 42, and reception low-noise amplifier 22 form a fourth reception circuit that transfers reception signals of communication band D from antenna 2 via antenna connection terminal 100.

According to the above-described circuit configuration, radio frequency module 1 is capable of performing at least one of simultaneously transmitting, simultaneously receiving, or simultaneously transmitting and receiving a radio frequency signal of either communication band A or communication band B and a radio frequency signal of either communication band C or communication band D.

It should be noted that, in the radio frequency module according to the present disclosure, the above-described four transmission circuits and the above-described four reception circuits need not be connected to antenna connection terminal 100 via switch 55, and the four transmission circuits and the four reception circuits may be connected to antenna 2 via a different terminal. Furthermore, it is sufficient that the radio frequency module according to the present disclosure includes at least (1) at least one of the first transmission circuit, the second transmission circuit, the third transmission circuit, or the fourth transmission circuit, (2) at least one of the first reception circuit, the second reception circuit, the third reception circuit, or the fourth reception circuit, and (3) PA control circuit 13.

Furthermore, in the radio frequency module according to the present disclosure, it is sufficient that the first transmission circuit includes transmission power amplifier 11 and matching circuit 31. In addition, it is sufficient that the second transmission circuit includes transmission power amplifier 11 and matching circuit 31. Moreover, it is sufficient that the third transmission circuit includes transmission power amplifier 12 and matching circuit 32. Furthermore, it is sufficient that the fourth transmission circuit includes transmission power amplifier 12 and matching circuit 32.

Here, when the respective circuit elements of radio frequency module 1 described above are to be mounted on a single module board as a small front-end circuit, it is necessary to reduce the circuit component layout area of the module board surface. In this case, it is assumed that, for example, PA control circuit 13 and the transmission-related circuit components connected to transmission paths AT to DT are to be placed in close proximity. In this case, there are instances where the digital control signal output from PA control circuit 13 causes a spurious signal to be generated in the adjacent channel of the transmission signal. Accordingly, there is the problem that the ACLR of the transmission signals deteriorates, and thus transmission signal quality deteriorates.

In contrast, radio frequency module 1 according to this embodiment has a configuration that suppresses electric field coupling, magnetic field coupling, or electromagnetic field coupling of PA control circuit 13 and the transmission-related circuit components. The configuration of radio frequency module 1 according to this embodiment which suppresses electric field coupling, magnetic field coupling, or electromagnetic field coupling will be described below.

2. Circuit Element Arrangement Configuration of Radio Frequency Module 1A According to Working Example 1

Figure 2A:
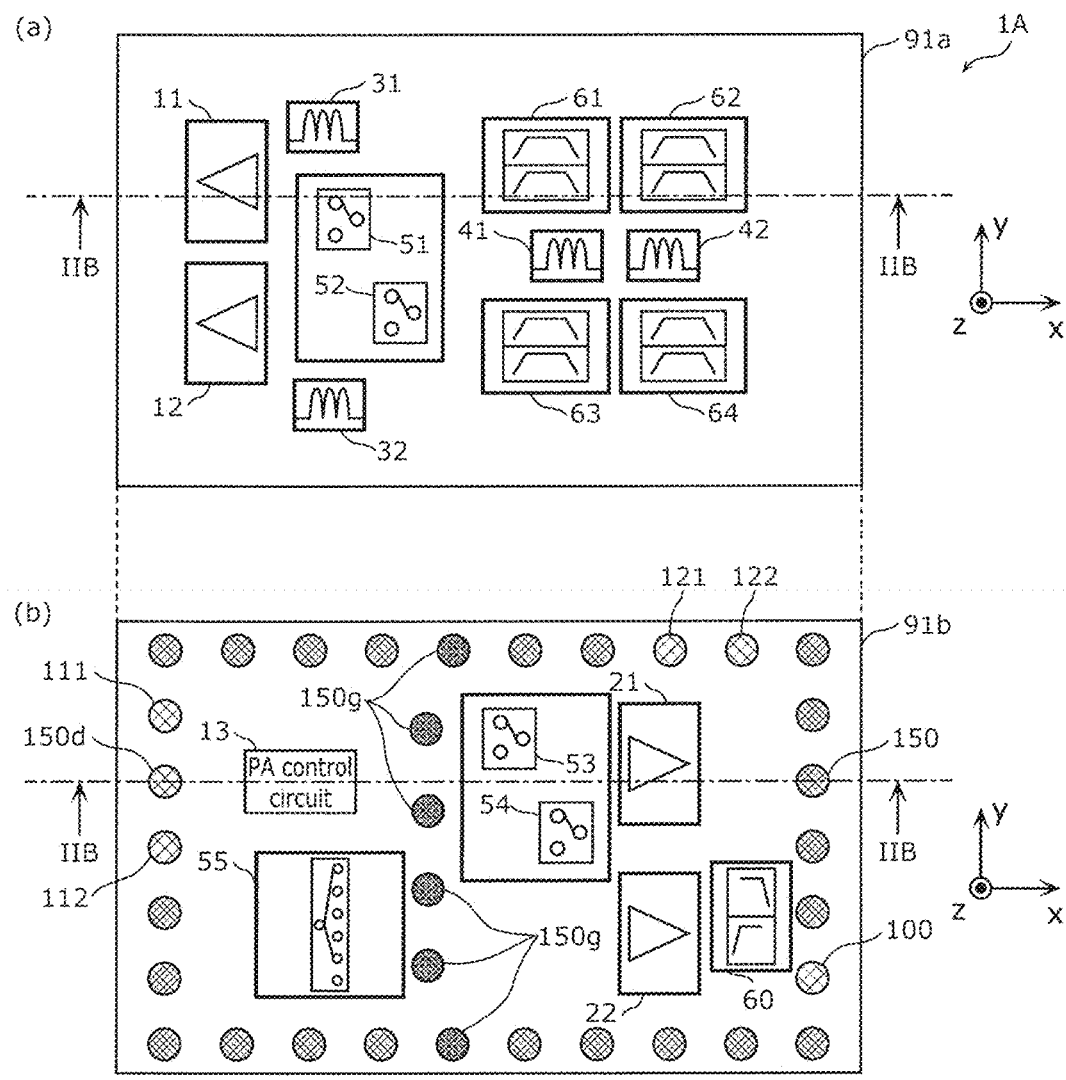
FIG. 2A is a schematic diagram illustrating a plan view configuration of a radio frequency module according to a Working Example 1.
Figure 2B:
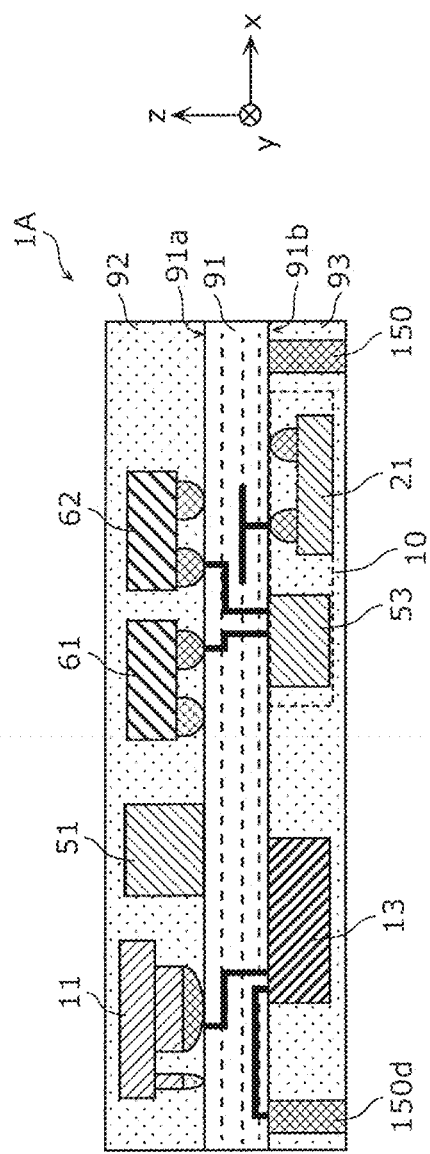
FIG. 2B is a schematic diagram illustrating a cross-sectional configuration of the radio frequency module according to Working Example 1.

FIG. 2A is a schematic diagram illustrating a plan view configuration of radio frequency module 1A according to Working Example 1. Furthermore, FIG. 2B is a schematic diagram illustrating a cross-sectional configuration of radio frequency module 1A according to Working Example 1, and specifically illustrates a cross-section taken along line IIB-IIB in FIG. 2A. It should be noted that (a) in FIG. 2A illustrates an arrangement diagram of circuit elements in the case where principal surface 91a of opposite principal surfaces 91a and 91b of module board 91 is viewed from the z-axis positive direction-side. On the other hand, (b) in FIG. 2A illustrates a see-through view of the arrangement of circuit elements in the case where principal surface 91b is viewed from the z-axis positive direction-side.

Radio frequency module 1A according to Working Example 1 shows a specific arrangement configuration of the respective circuit elements included in radio frequency module 1 according to the embodiment.

As illustrated in FIG. 2A and FIG. 2B, radio frequency module 1A according to the working example further includes module board and resin materials 92 and 93, in addition to the circuit configuration illustrated in FIG. 1.

Module board 91 has principal surface 91a (second principal surface) and principal surface 91b (first principal surface) on opposite sides, and is a board on which the transmission circuits and the reception circuits are mounted. For module board 91, for example, a low temperature co-fired ceramic (LTCC) board having a stacked structure of a plurality of dielectric layers, a high temperature co-fired ceramic (HTCC) board, a component-embedded board, a board having a redistribution layer (RDL), a printed circuit board, or the like can be used. It should be noted that antenna connection terminal 100, transmission input terminals 111 and 112, and reception output terminals 121 and 122 may be formed on module board 91.

Resin material 92 is disposed on principal face 91a of module board 91, covers a portion of the transmission circuits, a portion of the reception circuits, and principal surface 91a of module board 91, and has a function of ensuring reliability such as the mechanical strength and moisture resistance of the circuit elements included in the transmission circuits and reception circuits. Resin material 93 is disposed on principal face 91b of module board 91, covers some of the transmission circuits, some of the reception circuits, and principal surface 91b of module board 91, and has a function of ensuring reliability such as the mechanical strength and moisture resistance of the circuit elements included in the transmission circuits and reception circuits. It should be noted that resin materials 92 and 93 are not essential elements of the radio frequency module according to the present disclosure.

Each of matching circuits 31 and 32 includes at least a chip inductor (first inductor).

As illustrated in FIG. 2A and FIG. 2B, in radio frequency module 1A according to this working example, transmission power amplifiers 11 and 12, duplexers 61 to 64, switches 51 and 52, and matching circuits 31, 32, 41, and 42 are surface mounted on principal surface 91a of module board 91. On the other hand, PA control circuit 13, reception low-noise amplifiers 21 and 22, switches 53, 54, and 55, and diplexer 60 are surface mounted on principal surface 91b of module board 91. It should be noted that, although not illustrated in FIG. 2A and FIG. 2B, matching circuits 71 to 74 and coupler 80 may be surface mounted on either one of principal surfaces 91a and 91b of module board 91, or may be embedded in module board 91. It should be noted that since coupler 80 monitors the power intensity of the radio frequency signals transferred in radio frequency module 1A and outputs the power intensity to an external circuit such as RFIC 3 via coupler output terminal 180, it is desirable for coupler 80 to be mounted on principal surface 91b on the mother board-side.

It should be noted that, although not illustrated in FIG. 2A, the lines included in transmission paths AT, BT, CT, and DT and reception paths AR, BR, CR, and DR illustrated in FIG. 1 are formed inside module board 91 and on principal surfaces 91a and 91b. Furthermore, the aforementioned lines may be bonding wires which have both ends bonded to any of principal surfaces 91a and 91b and circuit elements included in radio frequency module 1A, and may be terminals, electrodes, or lines formed on the surface of the circuit elements included in radio frequency module 1A.

In this working example, as illustrated in FIG. 2A and FIG. 2B, PA control circuit 13 is disposed on principal surface 91b, and the inductor of matching circuit 31 and the inductor of matching circuit 32 are disposed on principal surface 91a.

According to the above-described configuration, PA control circuit 13 and the inductors of matching circuits 31 and 32 are disposed with module board 91 interposed therebetween. Accordingly, electric field coupling, magnetic field coupling, or electromagnetic field coupling of PA control circuit 13 and the inductors of matching circuits 31 and 32 can be suppressed. For this reason, it is possible to prevent a digital control signal output from PA control circuit 13 from causing the generation of a spurious signal in the adjacent channel of a transmission signal which passes the inductors of matching circuits 31 and 32. Accordingly, deterioration of the ACLR of the transmission signal can be suppressed. Therefore, it is possible to provide radio frequency module 1A that suppresses transmission signal quality deterioration.

Furthermore, in this working example, duplexers 61 to 64 and matching circuits 41 and 42 are first circuit components connected to reception paths AR to DR, and are disposed on principal surface 91a. On the other hand, PA control circuit 13 is disposed on principal surface 91b.

According to this configuration, PA control circuit 13 is disposed on principal surface 91b of module board 91, and the first circuit components connected to reception paths AR to DR are disposed on principal surface 91a. In other words, PA control circuit 13 and the first circuit components are disposed with module board 91 interposed therebetween. Accordingly, electric field coupling, magnetic field coupling, or electromagnetic field coupling of PA control circuit 13 and the first circuit components can be suppressed. For this reason, it is possible to prevent the harmonic of a digital control signal output from PA control circuit 13 from flowing into reception paths AR to DR. Therefore, it is possible to prevent the harmonic from flowing into any of reception paths AR to DR and causing reception sensitivity to deteriorate.

Furthermore, as illustrated in FIG. 2A, it is desirable that, in a plan view of module board 91, PA control circuit 13 and the first circuit components connected to reception paths AR to DR do not overlap. Accordingly, aside from PA control circuit 13 and the first circuit components being disposed with module board 91 interposed therebetween, it is possible to ensure sufficient distance between PA control circuit 13 and the first circuit components, and thus electric field coupling, magnetic field coupling, or electromagnetic field coupling of PA control circuit 13 and the first circuit components can be further suppressed.

It should be noted that PA control circuit 13 is connected to a control line that transfers digital control signals output from RFIC 3 and is connected by control lines to transmission power amplifiers 11 and 12 and switches 51 to 56, and is formed in a first semiconductor IC, for example.

It should be noted that radio frequency module 1A according to this working example has a configuration in which PA control circuit 13 is disposed on principal surface 91b and duplexers 61 to 64 and matching circuits 41 and 42 are disposed on principal surface 91a but is not limited to such configuration.

In the radio frequency module according to the present disclosure, it is sufficient that PA control circuit 13 be disposed on one of principal surfaces 91a and 91b, and that at least one (i.e., the first circuit component) of the circuit components given below is disposed on the other of principal surfaces 91a and 91b. Specifically, it is sufficient that the first circuit component be at least one of the following:

(1) Reception low-noise amplifier 21 or 22;
(2) The inductor of matching circuit 41 or the inductor or matching circuit 42;
(3) Switch 53 or 54;
(4) Any one of reception filters 61R to 64R or any one of duplexers 61 to 64;
(5) Duplexer 60; or
(6) Switch 55.

Accordingly, compared to a radio frequency module having a configuration in which PA control circuit 13 and the circuit components in (1) to (6) above are disposed on the same principal surface, electric field coupling, magnetic field coupling, or electromagnetic field coupling of PA control circuit 13 and the at least one of (1) to (6) above can be suppressed. Therefore, deterioration of reception sensitivity of reception paths AR to DR can be suppressed, and deterioration of signal quality of transmission signals output from radio frequency module 1A can be suppressed.

In radio frequency module 1A according to this working example, it is desirable that the first circuit component be, in particular, (4) any one of reception filters 61R to 64R or any one of duplexers 61 to 64 described above. This is because reception filters 61R to 64R and duplexers 61 to 64 have pass characteristics that deteriorate easily due to digital control signals.

It should be noted that it is desirable that module board 91 have a multilayer structure in which a plurality of dielectric layers are stacked, and that a ground electrode pattern is formed in at least one of the dielectric layers. Accordingly, the electromagnetic shielding function of module board 91 is improved.

Furthermore, in radio frequency module 1A according to this working example, a plurality of external-connection terminals 150 are disposed on the principal surface 91b-side of module board 91.

Antenna connection terminal 100 is configured using one of external-connection terminals 150, and is formed on principal surface 91b, at a position next to duplexer 60. According to this arrangement, the length of the line connecting antenna connection terminal 100 and duplexer 60 can be shortened, and thus transfer loss of transmission signals transferred in radio frequency module 1A can be reduced.

Furthermore, transmission input terminals 111 and 112 are configured using two of external-connection terminals 150, and are formed at positions overlapping transmission power amplifiers 11 and 12, on the other side of module board 91. According to this arrangement, the length of the line connecting transmission input terminal 111 and transmission power amplifier 11 can be shortened and the length of the line connecting transmission input terminal 112 and transmission power amplifier 12 can be shortened, and thus transfer loss of transmission signals transferred in radio frequency module 1A can be reduced.

Furthermore, reception output terminals 121 and 122 are configured using two of external-connection terminals 150, and are formed on principal surface 91b at positions next to reception low-noise amplifiers 21 and 22. According to this arrangement, the length of the line connecting reception output terminal 121 and reception low-noise amplifier 21 can be shortened and the length of the line connecting reception output terminal 122 and reception low-noise amplifier 22 can be shortened, and thus transfer loss of reception signals transferred in radio frequency module 1A can be reduced Furthermore, radio frequency module 1A exchanges electrical signals with the mother board disposed on the z-axis negative direction-side of radio frequency module 1A, via external-connection terminals 150. Furthermore, some external-connection terminals 150 are set to the ground potential of the mother board. Since reception low-noise amplifiers 21 and 22 and switches 53, 54, and 55 for which profile reduction is readily achievable are disposed on principal surface 91b which faces the mother board, out of principal surfaces 91a and 91b, and transmission power amplifiers 11 and 12 for which profile reduction is not readily achievable are not disposed on principal surface 91b, profile reduction of radio frequency module 1A as a whole can be achieved. Furthermore, since a plurality of external-connection terminals 150 which are applied as ground electrodes are arranged around reception low-noise amplifiers 21 and 22 which have a big impact on the reception sensitivity of the reception circuit, deterioration of reception sensitivity of the reception circuit can be suppressed.

As illustrated in FIG. 2A and FIG. 2B, external-connection terminals 150 may be columnar electrodes penetrating through resin material 93 in the z-axis direction, and may be bump electrodes formed on principal surface 91b. When external-connection terminals 150 are bump electrodes, resin material 93 on the principal surface 91b-side need not be included.

Furthermore, as illustrated in (b) in FIG. 2A, in radio frequency module 1A according to this working example, in a plan view of module board 91, external-connection terminals 150g which are set to the ground potential may be disposed between (i) reception low-noise amplifiers 21 and 22 and (ii) PA control circuit 13 which are disposed on principal surface 91b.

Accordingly, even when PA control circuit 13 and reception low-noise amplifiers 21 and 22 are disposed on principal surface 91b, PA control circuit 13 and reception low-noise amplifiers 21 and 22 are disposed with external-connection terminals 150g interposed therebetween. Accordingly, electric field coupling, magnetic field coupling, or electromagnetic field coupling of PA control circuit 13 and reception low-noise amplifiers 21 and 22 can be suppressed. For this reason, it is possible to further prevent digital noise output from PA control circuit 13 from flowing into reception paths AR to DR. Therefore, it is possible to further prevent the digital noise from flowing into any of reception paths AR to DR and causing reception sensitivity to deteriorate.

Furthermore, in radio frequency module 1A according to this working example, PA control circuit 13 is disposed on principal surface 91b and is connected to external-connection terminal 150d. External-connection terminal 150d is connected to RFIC 3 disposed on the z-axis negative direction-side, and conveys the digital control signals output from RFIC 3 to PA control circuit 13. For this reason, the aforementioned digital control signals do not reach the principal surface 91a-side, and thus digital noise caused by the digital control signals can be kept only on the principal surface 91b-side. Therefore, it is possible to prevent the digital noise caused by the digital control signals from flowing into radio frequency module 1A.

Furthermore, in radio frequency module 1A according to this working example, transmission power amplifiers 11 and 12 are disposed on principal surface 91a.

Among the circuit components included in radio frequency module 1A, transmission power amplifiers 11 and 12 are components that generate a large amount of heat. To improve the heat dissipation of radio frequency module 1A, it is important to dissipate the heat generated by transmission power amplifiers 11 and 12 to the mother board, using a heat dissipation path having a small thermal resistance. If transmission power amplifiers 11 and 12 were disposed on principal surface 91b, the electrode lines connected to transmission power amplifiers 11 and 12 would be disposed on principal surface 91b. For this reason, the heat dissipation path would include a heat dissipation path that passes through only the planar line pattern (along the xy plane direction) on principal surface 91b. This planar line pattern has a large thermal resistance due to being formed using metal thin-film. For this reason, when transmission power amplifiers 11 and 12 are disposed on principal surface 91b, heat dissipation deteriorates.

In contrast, when transmission power amplifiers 11 and 12 are disposed on principal surface 91a, transmission power amplifiers 11 and 12 and external-connection terminal 150 can be connected via a through electrode penetrating between principal surface 91a and principal surface 91b. Therefore, as a heat dissipation path of transmission power amplifiers 11 and 12, the heat dissipation path that passes through only the planar line pattern along the xy plane direction and has a large thermal resistance among the lines in module board 91, can be eliminated. Therefore, it is possible to provide a small radio frequency module 1A in which heat dissipation from transmission power amplifiers 11 and 12 to the mother board is improved.

Furthermore, according to the above-described configuration which improves the heat dissipation of radio frequency module 1A, external-connection terminals, and the like, for heat dissipation are disposed in the region of principal surface 91b which is located on the opposite side of transmission power amplifiers 11 and 12 in the z-axis direction, and thus the arrangement of circuit components is restricted. On the other hand, since high power transmission signals flow in the transmission path connecting transmission power amplifier 11 and switch 51, it is desirable to shorten the transmission path as much as possible. From this point of view, it is desirable for transmission power amplifier 11 and switch 51 to be disposed opposite each other with module board 91 interposed therebetween. However, due to the aforementioned restriction, it is difficult to dispose transmission power amplifier 11 and switch 51 opposite each other. Therefore, it is desirable that switch 51 be disposed on principal surface 91a on which transmission power amplifier 11 is disposed, so as to be next to transmission power amplifier 11.

It should be noted that reception low-noise amplifiers 21 and 22 and switches 53, 54, and 55 may be built into a single semiconductor IC 10. Accordingly, the z-axis direction height of principal surface 91b can be reduced, and the component mounting area of principal surface 91b can be reduced. Therefore, radio frequency module 1A can be miniaturized. In addition, semiconductor IC 10 may include PA control circuit 13.

Furthermore, it is desirable that, in a plan view of module board 91, switches 53 and 54 disposed on principal surface 91b and transmission power amplifiers 11 and 12 disposed on principal surface 91a do not overlap, and switches 51 and 52 disposed on principal surface 91a and switches 53 and 54 disposed on principal surface 91b do not overlap.

Accordingly, aside from (i) switches 53 and 54 connected to the reception paths and (ii) transmission power amplifiers 11 and 12 being disposed with module board 91 interposed therebetween, it is also possible to ensure sufficient distance between switches 53 and 54 and transmission power amplifiers 11 and 12. Furthermore, aside from (i) switches 53 and 54 connected to the reception paths and (ii) switches 51 and 52 connected to the transmission path being disposed with module board 91 interposed therebetween, it is also possible to ensure sufficient distance between switches 53 and 54 and switches 51 and 52. Accordingly, isolation between the transmission paths and the reception paths further improves, and thus it is possible to further prevent transmission signals, harmonics, and spurious waves of intermodulation distortion from flowing into the reception paths and causing deterioration of reception sensitivity.

Furthermore, as shown in radio frequency module 1A according to this working example, it is desirable that, in a plan view of module board 91, the inductor of matching circuit 41 disposed on principal surface 91a and switch 53 disposed on principal surface 91b overlap, and the inductor of matching circuit 42 disposed on principal surface 91a and switch 54 disposed on principal surface 91b overlap. Accordingly, since the inductor of matching circuit 41 and switch 53 are located opposite each other via module board 91, the length of the line connecting the inductor of matching circuit 41 and switch 53 can be shortened. Furthermore, since the inductor of matching circuit 42 and switch 54 are located opposite each other via module board 91, the length of the line connecting the inductor of matching circuit 42 and switch 54 can be shortened. Therefore, transfer loss in the reception paths can be reduced.

Furthermore, as shown in radio frequency module 1A according to this working example, it is desirable that, in a plan view of module board 91, at least one of duplexer 61 (or reception filter 61R) or 62 (or reception filter 62R) disposed on principal surface 91a and switch 53 disposed on principal surface 91b overlap. Accordingly, since at least one of duplexer 61 or 62 and switch 53 are located opposite each other via module board 91, the length of the line connecting the at least one of duplexer 61 or 62 and switch 53 can be shortened. Therefore, transfer loss in the transmission path can be reduced. Furthermore, it is desirable that at least one of duplexer 63 (or reception filter 63R) or 64 (or reception filter 64R) which are disposed on principal surface 91a and switch 54 which is disposed on principal surface 91b overlap. Accordingly, since at least one of duplexer 63 or 64 and switch 54 are located opposite each other via module board 91, the length of the line connecting the at least one of duplexer 63 or 64 and switch 54 can be shortened. Therefore, transfer loss in the transmission path can be reduced.

Furthermore, as shown in radio frequency module 1A according to this working example, it is desirable that, in a plan view of module board 91, transmission power amplifier 11, matching circuit 31, switch 51, and duplexer 61 (or transmission filter 61T) or 62 (or transmission filter 62T) are disposed in the stated order on principal surface 91a. Accordingly, transmission power amplifier 11, matching circuit 31, switch 51, and duplexer 61 or 62 are disposed on principal surface 91a in the same order as the electrical connecting order. Accordingly, the length of the line connecting transmission power amplifier 11, matching circuit 31, switch 51, and duplexer 61 or 62 can be shortened. Therefore, transfer loss in the transmission path can be reduced. Furthermore, it is desirable that transmission power amplifier 12, matching circuit 32, switch 52, and duplexer 63 (or transmission filter 63T) or 64 (or transmission filter 64T) are disposed in the stated order on principal surface 91a. Accordingly, transmission power amplifier 12, matching circuit 32, switch 52, and duplexer 63 or 64 are disposed on principal surface 91a in the same order as the electrical connecting order. Accordingly, the length of the line connecting transmission power amplifier 12, matching circuit 32, switch 52, and duplexer 63 or 64 can be shortened. Therefore, transfer loss in the transmission path can be reduced.

3. Circuit Element Arrangement Configuration of Radio Frequency Module 1C According to Working Example 1

Figure 2C:
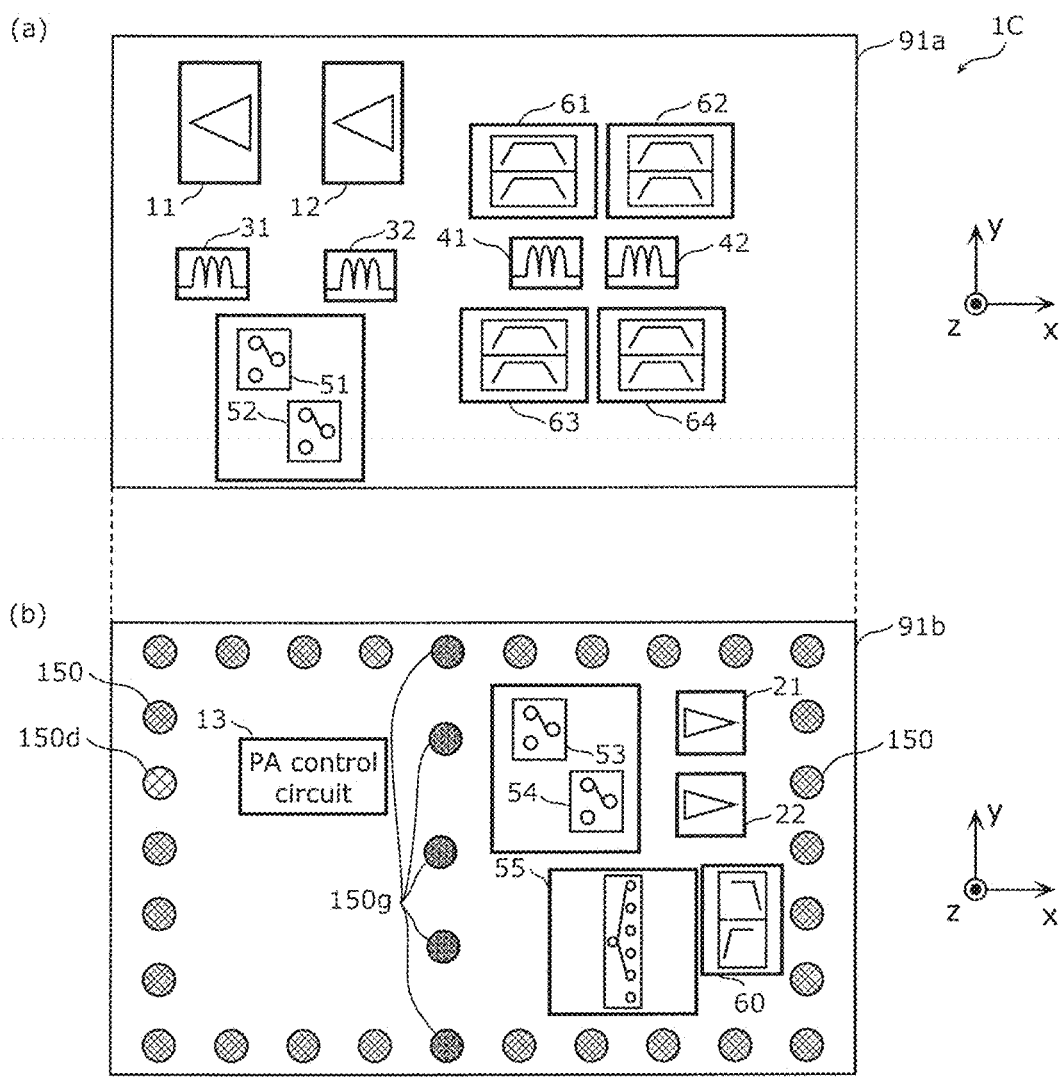
FIG. 2C is a schematic diagram illustrating a plan view configuration of a radio frequency module according to Variation 1.

FIG. 2C is a schematic diagram illustrating a plan view configuration of radio frequency module 1C according to Variation 1. It should be noted that (a) in FIG. 2C illustrates an arrangement diagram of circuit elements in the case where principal surface 91a of opposite principal surfaces 91a and 91b of module board 91 is viewed from the z-axis positive direction-side. On the other hand, (b) in FIG. 2C illustrates a see-through view of the arrangement of circuit elements in the case where principal surface 91b is viewed from the z-axis positive direction-side.

Radio frequency module 1C according to Variation 1 specifically shows the arrangement configuration of respective circuit elements included in radio frequency module 1 according to the embodiment.

Compared to radio frequency module 1A according to Working Example 1, radio frequency module 1C according to this variation is different in the arrangement configuration of switch 55. Hereinafter, radio frequency module 1C according to this variation will be described omitting description of points that are the same as in radio frequency module 1A according to Working Example 1 and focusing on the points that are different.

As illustrated in FIG. 2C, in radio frequency module 1C according to this variation, transmission power amplifiers 11 and 12, switches 51 and 52, duplexers 61 to 64, and matching circuits 31, 32, 41, and 42 are surface mounted on principal surface 91a of module board 91. On the other hand, PA control circuit 13, reception low-noise amplifiers 21 and 22, switches 53, 54, and 55, and diplexer 60 are surface mounted on principal surface 91b of module board 91.

In this variation, PA control circuit 13 is disposed on principal surface 91b, and the inductor of matching circuit 31 and the inductor of matching circuit 32 are disposed on principal surface 91a.

According to the above-described configuration, PA control circuit 13 and the inductors of matching circuits 31 and 32 are disposed with module board 91 interposed therebetween. For this reason, it is possible to prevent a digital control signal output from PA control circuit 13 from causing the generation of a spurious signal in the adjacent channel of a transmission signal which passes the inductors of matching circuits 31 and 32. Accordingly, deterioration of the ACLR of the transmission signal can be suppressed.

Furthermore, in radio frequency module 1C according to this variation, reception low-noise amplifiers 21 and 22 and switches 53 to 55 can be formed in a single semiconductor IC. Since external-connection terminals 150g are disposed between this semiconductor IC and PA control circuit 13, miniaturization is promoted while suppressing deterioration of reception sensitivity.

It should be noted that, in radio frequency module 1A according to Working Example 1 and radio frequency module 1C according Variation 1, external-connection terminals 150 may be disposed on principal surface 91a.

4. Circuit Element Arrangement Configuration of Radio Frequency Module 1B According to Working Example 2

Figure 3A:
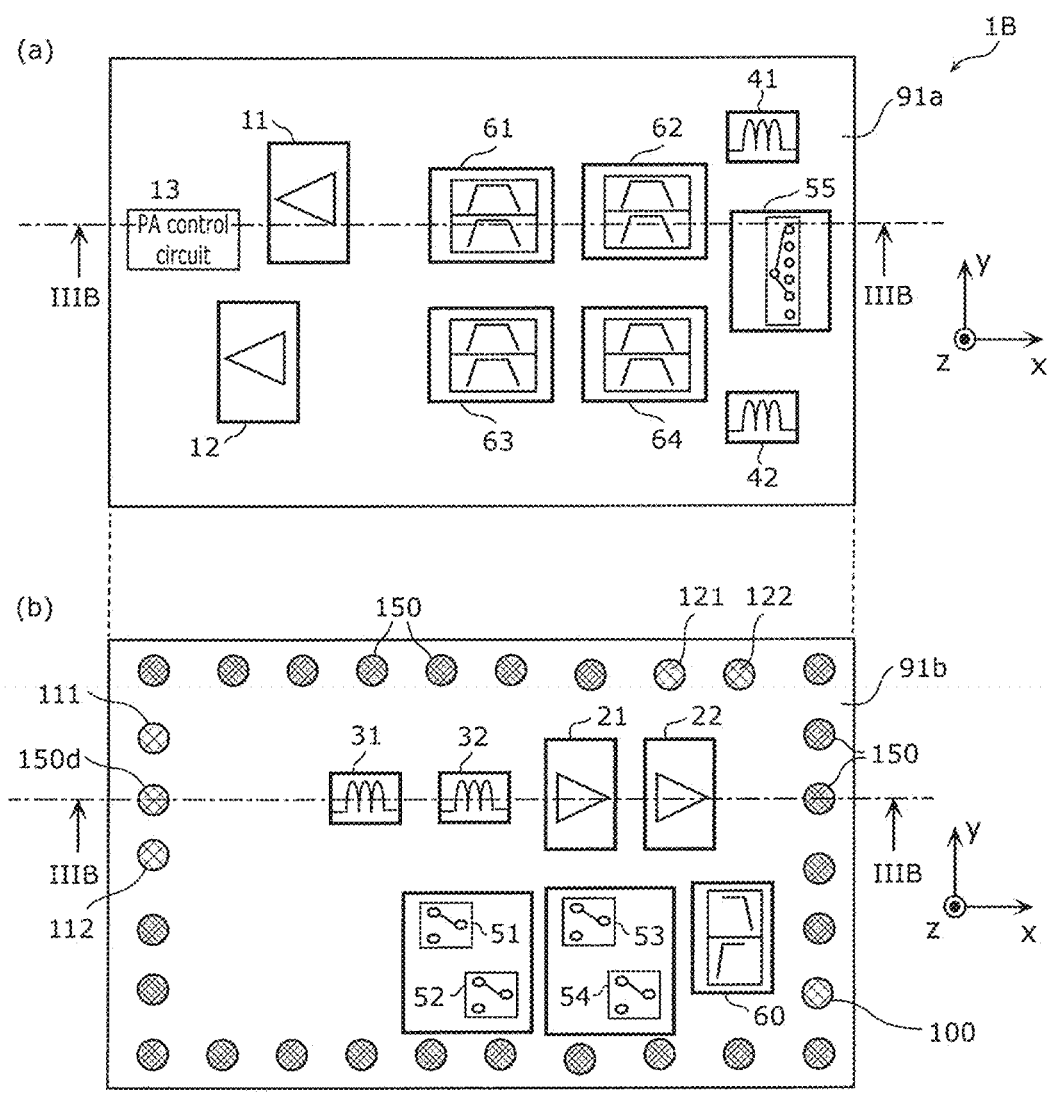
FIG. 3A is a schematic diagram illustrating a plan view configuration of a radio frequency module according to a Working Example 2.

FIG. 3A is a schematic diagram illustrating a plan view configuration of radio frequency module 1B according to Working Example 2. Furthermore, FIG. 3B is a schematic diagram illustrating a cross-sectional configuration of radio frequency module 1B according to Working Example 2, and specifically illustrates a cross-section taken along line IIIB-IIIB in FIG. 3A. It should be noted that (a) in FIG. 3A illustrates an arrangement diagram of circuit elements in the case where principal surface 91a of opposite principal surfaces 91a and 91b of module board 91 is viewed from the z-axis positive direction-side. On the other hand, (b) in FIG. 3A illustrates a see-through view of the arrangement of circuit elements in the case where principal surface 91b is viewed from the z-axis positive direction-side.

Radio frequency module 1B according to Working Example 2 specifically shows the arrangement configuration of respective circuit elements included in radio frequency module 1 according to the embodiment.

Compared to radio frequency module 1A according to Working Example 1, radio frequency module 1B according to this Working Example is different only in the arrangement configuration of circuit elements included in radio frequency module 1B. Hereinafter, radio frequency module 1B according to this working example will be described omitting description of points that are the same as in radio frequency module 1A according to Working Example 1 and focusing on the points that are different.

Module board 91 is a board having principal surface 91a (first principal surface) and principal surface 91b (second principal surface) on opposite sides. For module board 91, for example, an LTCC board having a stacked structure of a plurality of dielectric layers, an HTCC board, a component-embedded board, a board having an RDL, a printed circuit board, or the like can be used.

As illustrated in FIG. 3A and FIG. 3B, in radio frequency module 1B according to this working example, transmission power amplifiers 11 and 12, PA control circuit 13, switch 55, duplexers 61 to 64, and matching circuits 41 and 42 are surface mounted on principal surface 91a of module board 91. On the other hand, reception low-noise amplifiers 21 and 22, switches 51, 52, 53, and 54, matching circuits 31 and 32, and diplexer 60 are surface mounted on principal surface 91b of module board 91. It should be noted that, although not illustrated in FIG. 3A and FIG. 3B, matching circuits 71 to 74 and coupler 80 may be surface mounted on either one of principal surfaces 91a and 91b of module board 91, or may be embedded in module board 91.

In this working example, PA control circuit 13 is disposed on principal surface 91*a*, and the inductor of matching circuit 31 and the inductor of matching circuit 32 are disposed on principal surface 91*b*.

According to the above-described configuration, PA control circuit 13 and the inductors of matching circuits 31 and 32 are disposed with module board 91 interposed therebetween. Accordingly, electric field coupling, magnetic field coupling, or electromagnetic field coupling of PA control circuit 13 and the inductors of matching circuits 31 and 32 can be suppressed. For this reason, it is possible to prevent a digital control signal output from PA control circuit 13 from causing the generation of a spurious signal in the adjacent channel of a transmission signal which passes the inductors of matching circuits 31 and 32. Accordingly, deterioration of the ACLR of the transmission signal can be suppressed. Therefore, it is possible to provide radio frequency module 13 that suppresses transmission signal quality deterioration.

It should be noted that, in radio frequency module 1B according to this working example, the inductors of matching circuits 31 and 32 may be, for example, integrated passive devices (IPDs) which are integrated inside or on the surface of a Si board. According to this configuration, the inductors of matching circuits 31 and 32 are configured using IPDs for which profile reduction is achievable, and thus profile reduction is achievable for the principal surface 91*b*-side.

Furthermore, although not illustrated in FIG. 3A and FIG. 3B, in a plan view of module board 91, PA control circuit 13 and switch 51 may at least partially overlap. Alternatively, in a plan view of module board 91, PA control circuit 13 and switch 52 may at least partially overlap.

Accordingly, since the control line connecting PA control circuit 13 and switch 51 or 52 can be shortened, it is possible to further prevent the digital control signal output from PA control circuit 13 to switch 51 or 52 from causing the generation of a spurious signal in the adjacent channel of the transmission signal that passes switch 51 or 52. Accordingly, deterioration of the ACLR of the transmission signal can be further suppressed.

In this working example, reception low-noise amplifier 21 and 22, switches 53 and 54, and diplexer 60 are first circuit components connected to reception paths AR to DR, and are disposed on principal surface 91*b*. On the other hand, PA control circuit 13 is disposed on principal surface 91*a*. In other words, PA control circuit 13 and the first circuit components are disposed with module board 91 interposed therebetween.

According to this configuration, PA control circuit 13 is disposed on principal surface 91*a* of module board 91, and the first circuit components connected to reception paths AR to DR are disposed on principal surface 91*b*. In other words, PA control circuit 13 and the first circuit components are disposed with module board 91 interposed therebetween. Accordingly, electric field coupling, magnetic field coupling, or electromagnetic field coupling of PA control circuit 13 and the first circuit components can be suppressed. For this reason, it is possible to prevent the harmonic of a digital control signal input to or output from PA control circuit 13 from flowing into reception paths AR to DR. Therefore, it is possible to prevent the harmonic from flowing into any of reception paths AR to DR and causing reception sensitivity to deteriorate.

In radio frequency module 1B according to this working example, it is desirable that diplexer 60 in particular is a first circuit component. This is because the chip inductor included in diplexer 60 is easily affected by control signals.

Furthermore, in radio frequency module 1B according to this working example, it is desirable that reception low-noise amplifier 21 or 22 in particular is a first circuit component. Specifically, PA control circuit 13 is disposed on principal surface 91*a*, and reception low-noise amplifier 21 or 22 is disposed on principal surface 91*b*.

This is because deterioration of reception sensitivity is great when reception low-noise amplifier 21 or 22 located in the back-most stage of a reception path is affected by a digital control signal. Accordingly, electric field coupling, magnetic field coupling, or electromagnetic field coupling of PA control circuit 13 and reception low-noise amplifiers 21 or 22 can be suppressed. For this reason, it is possible to prevent the harmonic of a digital control signal input to or output from PA control circuit 13 from flowing into reception paths AR to DR via reception low-noise amplifier 21 or 22. Therefore, it is possible to prevent the harmonic from flowing into any of reception paths AR to DR and causing reception sensitivity to deteriorate.

It should be noted that reception low-noise amplifiers 21 and 22 and switches 53 and 54 may be included in a single semiconductor IC. In addition, the semiconductor IC may include switches 51 and 52. Accordingly, radio frequency module 1B can be further miniaturized.

Furthermore, as illustrated in FIG. 3A, it is desirable that, in a plan view of module board 91, PA control circuit 13 and the first circuit components connected to reception paths AR to DR do not overlap. Accordingly, aside from PA control circuit 13 and the first circuit components being disposed with module board 91 interposed therebetween, it is possible to ensure sufficient distance between PA control circuit 13 and the first circuit components, and thus electric field coupling, magnetic field coupling, or electromagnetic field coupling of PA control circuit 13 and the first circuit components can be further suppressed.

It should be noted that it is desirable that module board 91 have a multilayer structure in which a plurality of dielectric layers are stacked, and that a ground electrode pattern is formed in at least one of the dielectric layers. Accordingly, the electromagnetic shielding function of module board 91 is further improved.

Furthermore, in radio frequency module 1B according to this working example, a plurality of external-connection terminals 150 are disposed on the principal surface 91*b*-side of module board 91. Radio frequency module 1B exchanges electrical signals with the mother board disposed on the z-axis negative direction-side of radio frequency module 1B, via external-connection terminals 150. Furthermore, some external-connection terminals 150 are set to the ground potential of the mother board. Since reception low-noise amplifiers 21 and 22, switches 51 to 54, and diplexer 60 for which profile reduction is readily achievable are disposed on principal surface 91*b* which faces the mother board, out of principal surfaces 91*a* and 91*b*, and transmission power amplifiers 11 and 12 for which profile reduction is not readily achievable are not disposed on principal surface 91*b*, profile reduction of radio frequency module 1B as a whole can be achieved.

Furthermore, in radio frequency module 1B according to this working example, in a plan view of module board 91, transmission power amplifier 11 is disposed between (i) PA control circuit 13 and (ii) duplexers 61 to 64 and matching circuits 41 and 42 which are connected to the reception paths. It should be noted that the component that is disposed between PA control circuit 13 and duplexers 61 to 64 and matching circuits 41 and 42 which are connected to the reception paths need not be transmission power amplifier 11 as long as it is a conductive component. Moreover, a conductive component is an electronic component including a conductive member such as a signal extraction electrode, and is for example any one of a chip resistor, a chip capacitor, a chip inductor, a filter, a switch, or an active element such as an amplifier and a control circuit.

Accordingly, even when PA control circuit 13, duplexers 61 to 64, and matching circuits 41 and 42 are disposed on principal surface 91a, (i) PA control circuit 13 and (ii) duplexers 61 to 64 and matching circuits 41 and 42 are disposed with a conductive component interposed therebetween. For this reason, it is possible to further prevent the harmonic of a digital control signal input to or output from PA control circuit 13 from flowing into reception paths AR to DR. Therefore, it is possible to further prevent the harmonic from flowing into any of reception paths AR to DR and causing reception sensitivity to deteriorate.

Furthermore, in radio frequency module 1B according to this working example, transmission power amplifiers 11 and 12 are disposed on principal surface 91a.

Accordingly, as a heat dissipation path of transmission power amplifiers 11 and 12, the heat dissipation path that passes through only the planar line pattern along the xy plane direction and has a large thermal resistance among the lines in module board 91, can be eliminated. Therefore, it is possible to provide a small radio frequency module 1B in which heat dissipation from transmission power amplifiers 11 and 12 to the mother board is improved.

Furthermore, it is desirable that, in a plan view of module board 91, at least one of duplexer 61 (or reception filter 61R) or 62 (or reception filter 62R) disposed on principal surface 91a and switch 53 disposed on principal surface 91b overlap (not illustrated in FIG. 3A). Accordingly, since at least one of duplexer 61 or 62 and switch 53 are located opposite each other via module board 91, the length of the line connecting the at least one of duplexer 61 or 62 and switch 53 can be shortened. Therefore, transfer loss in the transmission path can be reduced. Furthermore, as illustrated in FIG. 3A, it is desirable that at least one of duplexer 63 (or reception filter 63R) or 64 (or reception filter 64R) disposed on principal surface 91a and switch 54 disposed on principal surface 91b overlap. Accordingly, since at least one of duplexer 63 or 64 and switch 54 are located opposite each other via module board 91, the length of the line connecting the at least one of duplexer 63 or 64 and switch 54 can be shortened. Therefore, transfer loss in the transmission path can be reduced.

It should be noted that, in radio frequency module 1B according to Working Example 2, external-connection terminals 150 may be disposed on principal surface 91a.

5. Advantageous Effects, and so on

As described above, radio frequency module 1A according to Working Example 1 includes module board 91 including principal surfaces 91a and 91b on opposite sides thereof, transmission power amplifier 11, PA control circuit 13 that controls transmission power amplifier 11, and a first inductor connected to an output terminal of transmission power amplifier 11. PA control circuit 13 is disposed on principal surface 91b, and the first inductor is disposed on principal surface 91b.

According to the above-described configuration, PA control circuit 13 and the first inductor of matching circuit 31 are disposed with module board 91 interposed therebetween.

Accordingly, electric field coupling, magnetic field coupling, or electromagnetic field coupling of PA control circuit 13 and the first inductor of matching circuit 31 can be suppressed. For this reason, it is possible to prevent a digital control signal output from PA control circuit 13 from causing the generation of a spurious signal in the adjacent channel of a transmission signal which passes the first inductor of matching circuit 31. Accordingly, deterioration of the ACLR of the transmission signal can be suppressed. Therefore, it is possible to provide radio frequency module 1A that suppresses transmission signal quality deterioration.

Furthermore, radio frequency module 1A may further include external-connection terminals 150, and external-connection terminals 150 may be disposed on principal surface 91b.

Accordingly, PA control circuit 13 disposed on principal surface 91b receives digital control signals from the mother board-side, via external-connection terminals 150. For this reason, the aforementioned digital control signals do not reach the principal surface 91a-side, and thus digital noise caused by the digital control signals can be kept only on the principal surface 91b-side. Therefore, it is possible to prevent the digital noise caused by the digital control signals from flowing into radio frequency module 1.

Furthermore, radio frequency module 1A may include reception low-noise amplifier 21. Reception low-noise amplifier 21 may be disposed on principal surface 91b. In a plan view of module board 91, external-connection terminals 150g, which are set to a ground potential, may be interposed between PA control circuit 13 and reception low-noise amplifier 21.

Accordingly, electric field coupling, magnetic field coupling, or electromagnetic field coupling of PA control circuit 13 and reception low-noise amplifier 21 can be suppressed. For this reason, it is possible to further prevent the harmonic of a digital control signal input to or output from PA control circuit 13 from flowing into reception paths AR and BR. Therefore, it is possible to further prevent the harmonic from flowing into either reception path AR or BR and causing reception sensitivity to deteriorate.

Furthermore, in radio frequency module 1A, transmission power amplifier 11 may be disposed on principal surface 91a.

Therefore, as a heat dissipation path of transmission power amplifier 11, the heat dissipation path that passes through only the planar line pattern and has a large thermal resistance among the lines in module board 91 can be eliminated. Therefore, it is possible to provide a small radio frequency module 1A in which heat dissipation from transmission power amplifier 11 to the mother board is improved.

Furthermore, radio frequency module 1B may include external-connection terminals 150. External-connection terminals 150 may be disposed on principal surface 91b, PA control circuit 13 may be disposed on principal surface 91a, and the first inductor may be disposed on principal surface 91b.

According to the above-described configuration, PA control circuit 13 and the first inductor of matching circuit 31 are disposed with module board 91 interposed therebetween. Accordingly, electric field coupling, magnetic field coupling, or electromagnetic field coupling of PA control circuit 13 and the first inductor of matching circuit 31 can be suppressed. Accordingly, deterioration of the ACLR of the transmission signal can be suppressed. Therefore, it is possible to provide radio frequency module 1B that suppresses transmission signal quality deterioration.

Furthermore, in radio frequency module 1B, the first inductor may be an integrated passive device.

Accordingly, since the inductor of matching circuit 31 is configured using IPDs for which profile reduction is achievable, profile reduction is achievable for the principal surface 91b-side.

Furthermore, radio frequency module 1B may include reception low-noise amplifier 21, and reception low-noise amplifier 21 may be disposed on principal surface 91b.

Accordingly, electric field coupling, magnetic field coupling, or electromagnetic field coupling of PA control circuit 13 and reception low-noise amplifier 21 can be suppressed. For this reason, it is possible to prevent the harmonic of a digital control signal input to or output from PA control circuit 13 from flowing into reception paths AR and BR via reception low-noise amplifier 21. Therefore, it is possible to prevent the harmonic from flowing into either of reception path AR or BR and causing reception sensitivity to deteriorate.

Furthermore, communication device 5 includes antenna 2, RFIC 3 that processes a radio frequency signal which is to be transmitted or has been received by antenna 2, and radio frequency circuit 1 that transfers the radio frequency signal between antenna 2 and RFIC 3.

Accordingly, it is possible to provide communication device 5 that suppresses transmission signal quality deterioration.

Other Embodiments

Although a radio frequency module and communication device according to the present disclosure have been described above based on an exemplary embodiment and working examples thereof, the radio frequency circuit and communication device according to the present disclosure are not limited to the foregoing embodiment and working examples. The present invention also encompasses other embodiments achieved by combining arbitrary elements in the above embodiment and working example thereof, variations resulting from various modifications to the embodiment and working example thereof that may be conceived by those skilled in the art without departing from the essence of the present disclosure, and various devices that include the radio frequency module and communication device according to the present disclosure.

Furthermore, for example, in the radio frequency module and communication device according to the foregoing embodiment and the working example thereof, another circuit element and line may be inserted in a path connecting respective circuit elements and signal paths disclosed in the drawings.

INDUSTRIAL APPLICABILITY

The present disclosure can be widely used in communication apparatuses such as a mobile phone, as a radio frequency module provided in a multiband-compatible front-end unit.

The invention claimed is:

1. A radio frequency module, comprising:
a module board including a first principal surface and a second principal surface on opposite sides of the module board;
a transmission power amplifier disposed on the module board;
a control circuit configured to control the transmission power amplifier;
a first inductor connected to an output terminal of the transmission power amplifier; and
one or more external-connection terminals, wherein
the control circuit is disposed on the first principal surface,
the first inductor is disposed on the second principal surface,
the one or more external-connection terminals are disposed on the first principal surface, and
the transmission power amplifier is disposed on the second principal surface.

2. The radio frequency module according to claim 1, further comprising:
a reception low-noise amplifier, wherein
the reception low-noise amplifier is disposed on the first principal surface, and
in a plan view of the module board, at least one of the one or more external-connection terminals is interposed between the control circuit and the reception low-noise amplifier, the at least one of the one or more external-connection terminals being set to a ground potential.

3. The radio frequency module according to claim 2, wherein
the first inductor is an integrated passive device.

4. The radio frequency module according to claim 1, wherein
the transmission power amplifier is connected to the one or more external-connection terminals via a through electrode.

5. The radio frequency module according to claim 1, wherein
the first inductor is included in a transmission output matching circuit connected to the output terminal of the transmission power amplifier.

6. The radio frequency module according to claim 1, further comprising:
a transmission filter; and
a switch connected between the transmission power amplifier and the transmission filter, wherein
the switch is disposed on the second principal surface.

7. The radio frequency module according to claim 6, wherein
in a plan view of the module board, the control circuit and the switch at least partially overlap.

8. The radio frequency module according to claim 1, further comprising:
a transmission filter; and
a switch connected between the transmission power amplifier and the transmission filter, wherein
the switch is disposed on the first principal surface.

9. A communication device, comprising:
an antenna;
a radio frequency (RF) signal processing circuit configured to process a radio frequency signal which is to be transmitted or has been received by the antenna; and
a radio frequency module configured to transfer the radio frequency signal between the antenna and the RF signal processing circuit, the radio frequency module including
a module board including a first principal surface and a second principal surface on opposite sides of the module board,
a transmission power amplifier disposed on the module board,
a control circuit configured to control the transmission power amplifier, a first inductor connected to an output terminal of the transmission power amplifier, and one or more external-connection terminals, wherein the control circuit is disposed on the first principal surface, the first inductor is disposed on the second principal surface, the one or more external-connection terminals are disposed on the first principal surface, and the transmission power amplifier is disposed on the second principal surface.

10. The communication device according to claim 9, wherein the radio frequency module further comprising:

a reception low-noise amplifier, wherein the reception low-noise amplifier is disposed on the first principal surface, and in a plan view of the module board, at least one of the one or more external-connection terminals is interposed between the control circuit and the reception low-noise amplifier, the at least one of the one or more external-connection terminals being set to a ground potential.

11. The communication device according to claim 10, wherein the first inductor is an integrated passive device.

* * * * *